United States Patent [19]

Caspari et al.

[11] 3,913,029

[45] Oct. 14, 1975

[54] ELECTRONIC AUTOMATIC FREQUENCY TUNING SYSTEM

[75] Inventors: Fred W. Caspari, South Bend; Wayne C. Johnson, Columbia City, both of Ind.

[73] Assignee: The Magnavox Company, Fort Wayne, Ind.

[22] Filed: June 5, 1974

[21] Appl. No.: 476,484

[52] U.S. Cl. ...................... 331/4; 325/421; 331/11; 331/17; 331/19; 331/30

[51] Int. Cl.$^2$ ........................................ H03B 3/04

[58] Field of Search ........................... 331/4, 10–12, 331/17, 19, 30, 32; 325/421

[56] References Cited

UNITED STATES PATENTS

| | | | |
|---|---|---|---|
| 3,641,434 | 2/1972 | Yates et al. | 331/19 X |
| 3,723,898 | 3/1973 | Tewksbury | 331/4 |

*Primary Examiner*—Siegfried H. Grimm
*Attorney, Agent, or Firm*—Thomas A. Briody; William J. Streeter; Joe E. Barbee

[57] ABSTRACT

Apparatus and method for providing an automatic frequency tuning system capable of supplying a local oscillator signal with a preselected frequency. The frequency of an output signal of the local oscillator is electronically varied across a frequency region which includes the preselected frequency. The output signal of the local oscillator is combined with the output signal of a reference signal generator. After the combination of the local oscillator signal with the reference oscillator signal produces a preestablished condition which is the result of the local oscillator signal attaining the preselected frequency, the frequency of the local oscillator signal is held constant. The local oscillator signal is thereafter compared to the reference oscillation signal and a change in the local oscillator signal frequency is corrected by means of an automatic frequency control feedback loop containing a discrimintor circuit.

7 Claims, 4 Drawing Figures

ELECTRONIC AUTOMATIC FREQUENCY TUNING SYSTEM

BACKGROUND OF THE INVENTION

1. Field of the Invention

This invention relates generally to apparatus for automatically tuning an oscillator to a preselected frequency, and more particularly to an automatic tuning circuit for use with a plurality of information-bearing frequency channels systematically dispersed throughout a range of frequencies. Upon identification of a condition resulting for the attainment of the preselected frequency by the oscillator output signal, an automatic frequency control (AFC) circuit is used to stabilize the frequency of the oscillator signal.

2. Description of the Prior Art

An automatic frequency control circuit typically is comprised of a local oscillator, a signal mixing circuit such as a heterodyne conversion transducer, an amplifier tuned to a predetermined intermediate frequency and a discriminator circuit designed to operate about the predetermined intermediate frequency. The output signal of the discriminator controls the frequency of the output signal of the local oscillator. A received signal, for which demodulation is desired, is typically applied to the mixing circuit. The combination of the received signal and the local oscillator signal produces an intermediate frequency signal which is applied to the tuned amplifier. The output signal of the local oscillator is used to convert the received signal and the relationship between the local oscillator signal frequency and the received signal frequency is stabilized by the circuit.

It is known in the prior art to provide an AFC circuit with mechanical apparatus for providing the coarse adjustment of the local oscillator. The coarse adjustment typically places the intermediate frequency signal within the operating range of the tuned amplifier and the discriminator circuit. The AFC circuit thereafter provides the vernier tuning for the satisfactory demodulation of the received signal. Because of problems associated with deterioration of mechanical apparatus, it is desirable to provide coarse adjustment by electronic means.

The characteristics of the tuned amplifier and more importantly, the discriminator circuit, provide the limit for the range over which a received signal can be stabilized and demodulated. Providing an expanded frequency range for these characteristics, for example to provide greater signal tuning capability, would increase the possibility of identifying and demodulating an undesired signal falling within the range of the amplifier and discriminator characteristics.

Furthermore, in conventional AFC circuits, the loss of the received signal, which contributes to the intermediate frequency signal, can produce undesirable drift in the frequency of the local oscillator output signal.

There are many applications, such as commercial broadcast television, where the received signal (i.e. the signal transmitted by the television station) is rigidly controlled. The AFC circuit originally was provided to minimize the effects on the operation of a television receiver of frequency shifts in the local oscillator. Shifts of the broadcast signals are unimportant, so that the necessity for utilizing the received signal in the AFC loop is minimized.

It is therefore an object of the present invention to provide an improved automatic frequency tuning circuit.

It is another object of the present invention to provide an automatic frequency tuning circuit capable of electronic coarse adjustment over a preestablished frequency spectrum.

It is a further object of the present invention to provide an automatic electronic frequency tuning circuit for information-bearing channels in a wide frequency range without compromising fine tuning capability.

It is yet another object of the present invention to provide apparatus for stabilizing a local oscillator output signal by means of an AFC circuit during temporary loss of received signal.

It is a more particular object of the present invention to provide a voltage controlled oscillator and a controllable voltage source in an automatic frequency tuning circuit for sweeping the frequency of the oscillator signal across a frequency spectrum in which at least one desired information-bearing frequency band is located.

It is still another particular object of the present invention to provide apparatus for suspending scanning over a range of frequencies by an oscillator signal in an AFC circuit at a frequency determined by a reference frequency signal.

It is yet another particular object of the present invention to provide apparatus for comparing a signal having a varying frequency with a reference frequency signal in order to identify a predetermined frequency of the varying signal.

It is yet another object of the present invention to provide an electronic automatic frequency tuning circuit with a reference frequency signal, which maintains a substantially constant oscillator frequency during loss of the received signal.

It is yet a further object of the present invention to provide an electronic automatic frequency tuning circuit having a first feedback loop for identifying a predetermined oscillator signal frequency and a second feedback loop for maintaining the predetermined oscillator signal.

It is a still further object of the present invention to provide an electronic automatic frequency tuning circuit which, upon entry of data, can identify and maintain an oscillator signal having a frequency determined by the entered data.

SUMMARY OF THE INVENTION

The aforementioned and other objects are accomplished, according to the present invention, by an electronic automatic frequency tuning circuit comprising two sets of apparatus for controlling the signal of variable frequency local oscillator. The first set of apparatus varies the frequency of the local oscillator until a predetermined relationship between the local oscillator signal and a reference generator signal is identified. Upon identification of the predetermined relationship, the second set of apparatus stabilizes the frequency of the oscillator output signal at substantially constant value. To stabilize the frequency of the oscillator signal, the reference generator signal and the local oscillator signal are combined and a resulting difference frequency signal applied to a discriminator. The discriminator provides an output signal which applies a control signal to the oscillator resulting in oscillator signal frequency corrections compensating for changes in the oscillator signal frequency.

The automatic frequency tuning circuit is not dependent on the received signal, the signal for which demodulation is typically desired, and therefore a loss of the received signal does not affect the frequency of the oscillator signal.

The reference oscillator can be apparatus for producing a comb of harmonic frequencies. By varying the controllable oscillator signal frequency beginning at a known initial value, the number of signals resulting from a preselected relationship, e.g. predetermined beat frequencies, occurring between the reference oscillator signal and the variable oscillator can be used to determine the predetermined relationship.

These and other features of the invention will be understood upon reading of the following description along with the drawings.

DESCRIPTION OF THE PREFERRED EMBODIMENT

Detailed Description of the Figures

Figure 1:
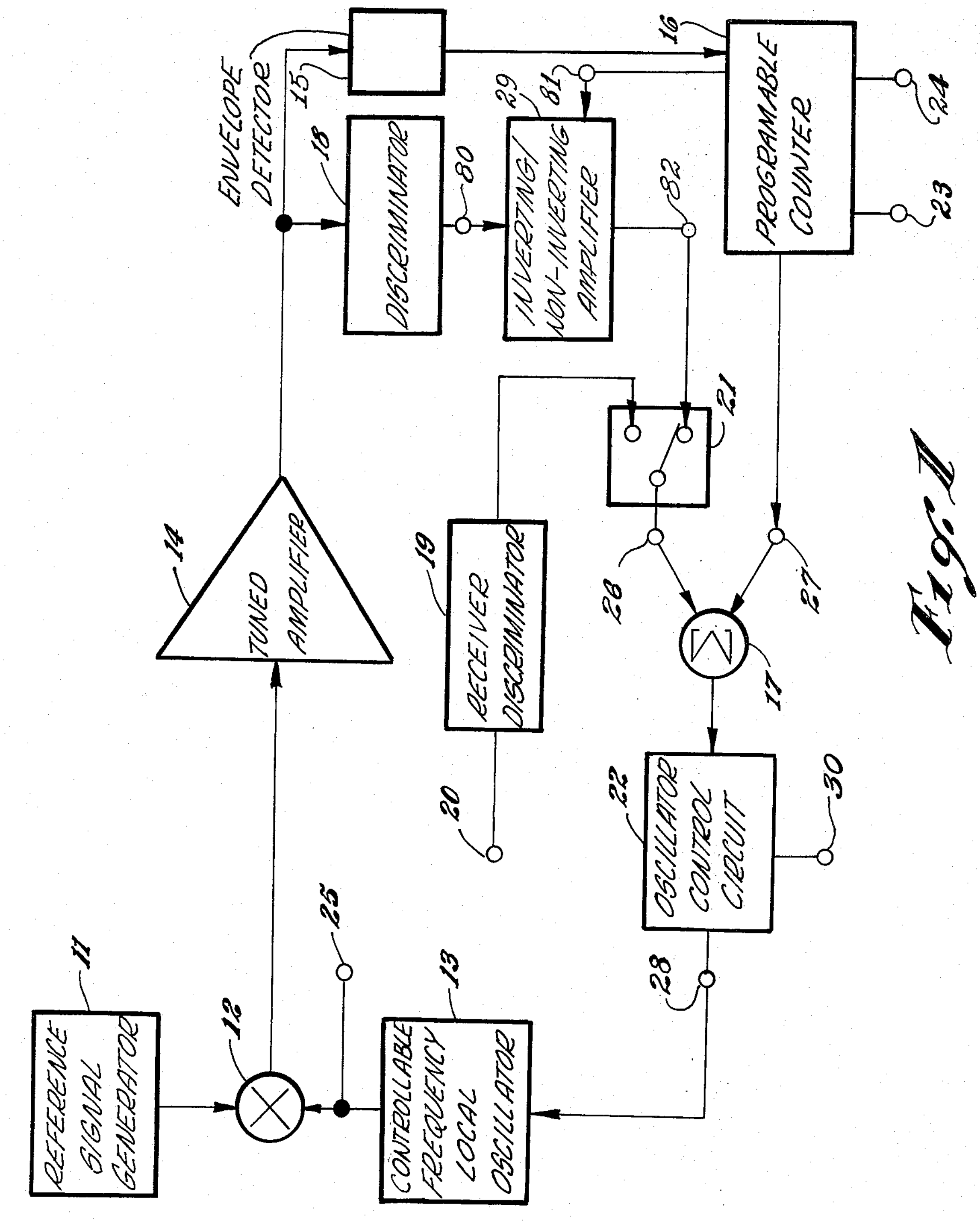
FIG. 1 is a block diagram of the electronic automatic frequency tuning circuit according to the present invention.

Referring first to FIG. 1, a controllable frequency local oscillator 13 provides a signal having a frequency determined by an output signal from oscillator control circuit 22. In the preferred embodiment, the local oscillator is comprised of a voltage controlled oscillator. The output signal of oscillator 13 is applied to mixing circuit 12 and to terminal 25. Mixing circuit 12 is a heterodyne conversion transducer in the preferred embodiment. An output signal from reference signal generator 11 is also applied to mixing circuit 12. The output signal generator 11 is also applied to mixing circuit 12. The output signal of mixing circuit 12 is applied to tuned amplifier 14. The output signal of amplifier 14 is applied to discriminator 18 and to envelope detector 15. Discriminator 18 is a circuit for providing output signal whose amplitude is dependent upon the frequency of an input signal. Envelope detector 15 produces an output signal which is substantially the envelope of an input signal. Reference signal generator 11 can consist of apparatus for providing a single frequency output signal, an output signal having a plurality of frequencies or an output signal comprising a comb of harmonic frequency components.

The output signal of envelope detector 15 is applied to programmable counter system 16. According to the preferred embodiment, programmable counter system 16 applies a positive signal through terminal 27 to a summing network 17 upon removal of a reset signal applied to terminal 23 of system 16. The positive signal is removed from the output of system 16 upon identification of a given number of pulses, applied by detector 15 to system 16. The number of pulses required to remove the positive signal from the output of system 16 can be changed by signals applied to terminal 24.

The output signal of discriminator 18 is applied to inverting/noninverting amplifier 29. Amplifier 29 is coupled to system 16 and the output signal of amplifier 29 is coupled to one input terminal of a switch 21. An output signal from a receiver discriminator 19 is applied to a second input terminal of switch 21. An output terminal of switch 21 is coupled through terminal 26 to summing network 17. The output signal from the summing network 17 is applied to oscillator control circuit 22. An input terminal 30 for applying a reset signal is coupled to oscillator control circuit 22. This reset signal establishes the initial value of signal applied to terminal 28 and consequently to oscillator 13, thereby initializing the frequency of the oscillator signal.

Figure 2:
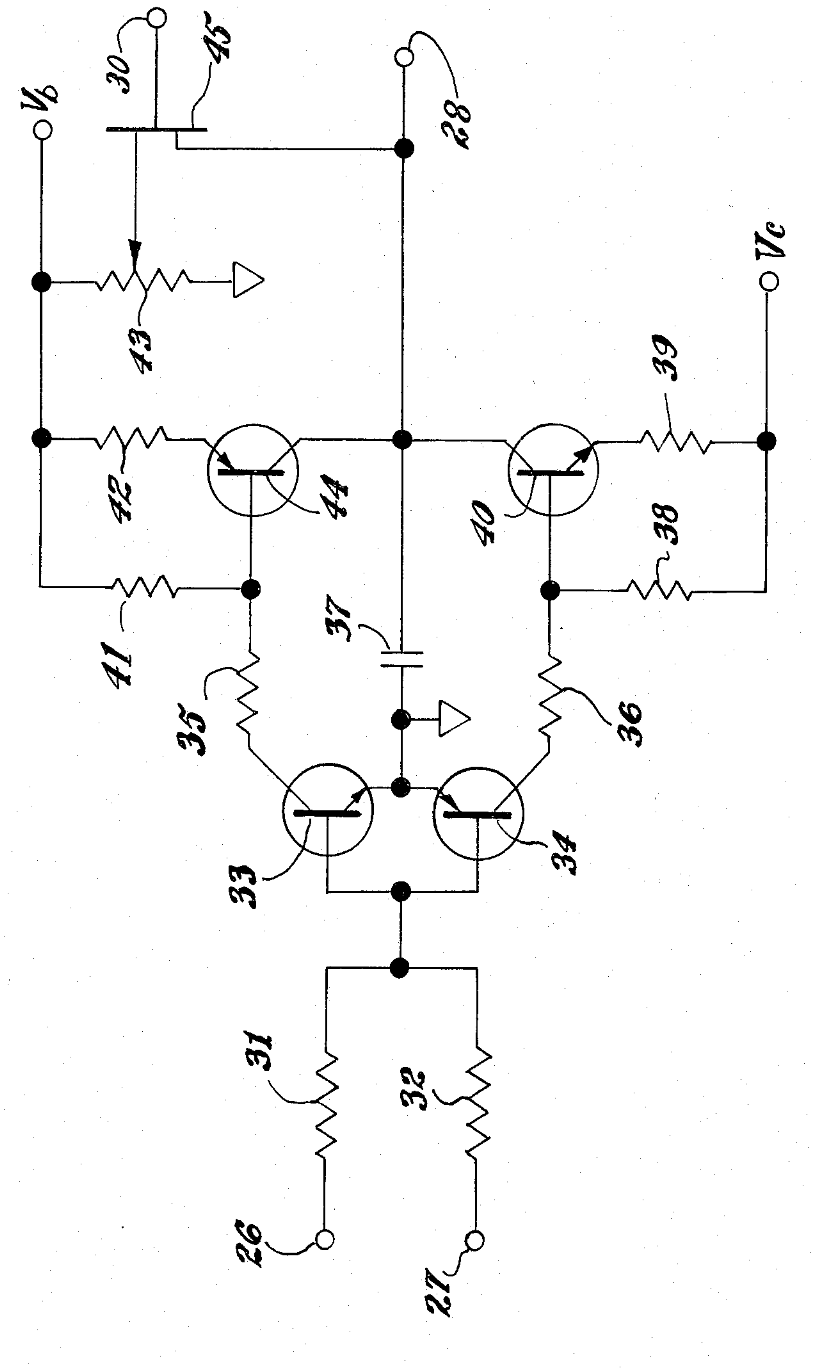
FIG. 2 is a circuit diagram according to the preferred embodiment, of the apparatus producing the input signal of the voltage controlled oscillator.

Referring next to FIG. 2, a circuit diagram of the summing network 17 and the oscillator control circuit 22 is shown. Terminal 26 is coupled to a first terminal of resistor 31. A second terminal of resistor 31 is coupled through resistor 32 to terminal 27, to a base of pnp transistor 34, and a base of npn transistor 33. An emitter of transistor 33 and an emitter of transistor 34 are coupled to a common terminal. The collector of transistor 33 is coupled through resistor 35 to a first terminal of resistor 41 and to a base connection of pnp transister 44. A potential source $V_b$ is coupled to a second terminal of resistor 41, through resistor 42 to an emitter of transistor 44, and through potentiometer 43 to the common terminal. The variable connection of potentiometer 43 is coupled to a drain terminal of field effect transistor 45. A gate terminal of transistor 45 is coupled to terminal 30, while a source terminal of transistor 45 is coupled to terminal 28.

A collector terminal of transistor 34 is coupled through resistor 36 to a base terminal of npn transistor 40 and to a first terminal of resistor 38. A potential source $V_c$ is coupled to a second terminal of resistor 38 and, through resistor 39, to an emitter terminal of transistor 40. Terminal 28 is coupled to a collector terminal of transistor 44, a collector terminal of transistor 40 and through capacitor 37 to the common terminal.

Figure 3A:
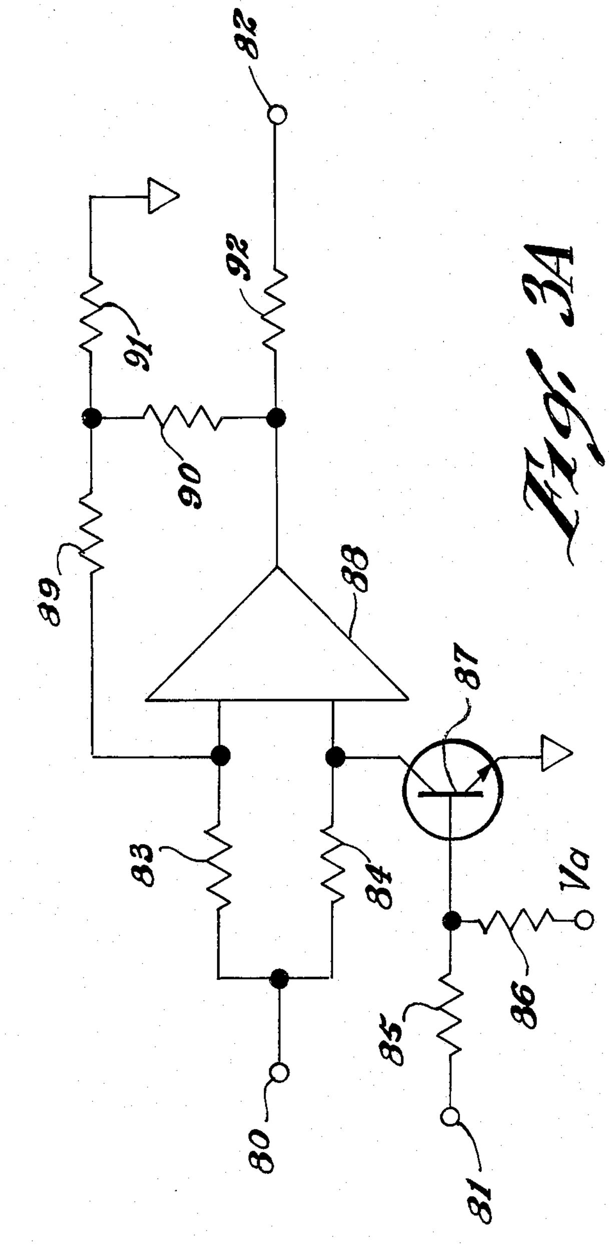
FIG. 3A is a circuit diagram of a discriminator amplifier which provides an amplified discriminator output signal in response to a first signal and which provides an inverted and amplified discriminator output signal in the absence of the first signal.

Referring now to FIG. 3A, a circuit diagram for the inverting/noninverting amplifier 29 coupled between discriminator 18 and switch 21 is shown. Terminal 80 is coupled through resistor 83 to a first input terminal of amplifier 88, and through resistor 84 to a second input terminal of amplifier 88. An output terminal of amplifier 88 is coupled, through resistor 92 to terminal 82 and is coupled to a first terminal of resistor 90. A second terminal of resistor 90 is coupled through resistor 91 to the common terminal and through resistor 89 to the first input terminal of amplifier 88.

The second input terminal of amplifier 88 is coupled to a collector terminal of transistor 87. The emitter terminal of transistor 87 is coupled to the common terminal. The base of transistor 87 is coupled through resistor 85 to terminal 81 and through resistor 86 to potential source $V_a$.

Figure 3B:
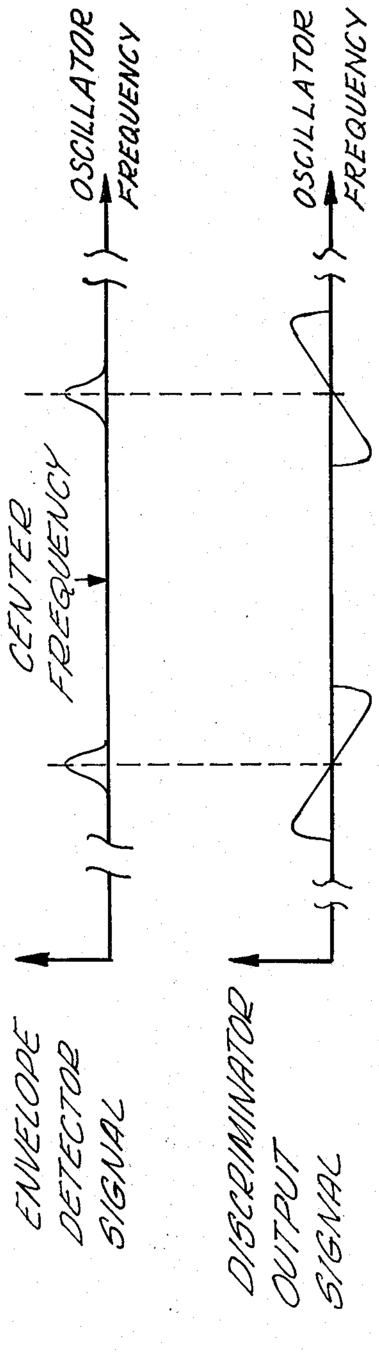
FIG. 3B is a pair of graphs showing the response of the envelope detector and the response of the discriminator as local oscillator frequency is varied in the region of a reference frequency.

Referring now to FIG. 3B, the function of the inverting amplifier used in conjunction with discriminator 18 is shown. The upper diagram shows the envelope of constant amplitude beat frequency signal relative to a center frequency. The center frequency shown in FIG. 3B, in the preferred embodiment, can be of the frequencies of a comb of harmonic frequency signals. The lower diagram indicates how the output of the discriminator must be reversed, depending upon the use of the upper or lower beat frequency in the automatic frequency tuning circuit. As will be apparent to those skilled in the art, for the beat frequency positioned below the center frequency, as the local oscillator increases, the beat frequency decreases. For the beat frequency position above the center frequency, as the local oscillator increases, the beat frequency increases.

Operation of the Preferred Embodiment

The output signal of the frequency-controllable local oscillator 13 provides a frequency to be used in a receiver unit coupled to terminal 25. Typically, the local oscillator frequency is mixed or heterodyned with a received or broadcast signal to produce a single intermediate difference frequency to which succeeding receiver circuits are tuned. The intermediate frequency furthermore responds to changes in frequency of the broadcast signal by corresponding changes in the intermediate. In the preferred embodiment, the local oscillator 13 is comprised of a voltage controlled oscillator. However, signals broadcast by television transmitter typically have relatively stable and well-defined frequencies permitting the use of an internal frequency signal source in an automatic frequency tuning system.

The output signal from the voltage controlled oscillator is mixed or heterodyned with a signal having a frequency spectrum determined by an internal oscillator comprising part of the reference signal generator such as a crystal oscillator. The output signal from the reference signal generator is mixed with the output signal from the voltage controlled oscillator in mixing circuit 12.

In the preferred embodiment, the tuned amplifier 14 is tuned to 1 MHz, so that when the frequency of the local oscillator signal and the frequency of the signal generator differ by 1 MHz, a signal will be produced at the output terminal of amplifier 14.

The output signal of amplifier 14 is applied to an envelope detector 15 and to discriminator 18. As the oscillator 13 is providing a signal with changing frequency, the output signal of the envelope detector is typically a pulse and is applied to a programmable counter system 16. Upon removal of the preset signal, programmable counter system 16 applies a positive signal to terminal 27 of oscillator control circuit 22. This positive signal produces a continuously increasing voltage level at the output terminal of the oscillator control circuit 22. The increasing voltage level causes the voltage controlled oscillator to provide a signal having increasing frequency.

However, when a predetermined number of pulses have been received by system 16 from envelope detector 15, the signal applied to terminal 27 causing the oscillator control circuit 22 to produce an increasing voltage is removed and the loop formed by the discriminator 18 and the inverting/noninverting amplifier 29 determines the signal controlling voltage controlled oscillator 13. In the preferred embodiment, the positive signal from the program system 16 supercedes output signal from amplifier 29. The coupling of the discriminator in an automatic frequency control type circuit provides the stabilization of the frequency of the voltage controlled oscillator signal. It will be clear that the output of the discriminator circuit must be inverted when the beat frequency above the center frequency, as opposed to below the center frequency, is chosen. In the preferred embodiment, a signal from system 16 automatically controls the mode of operation of amplifier 29. It will be apparent that the signal generated by the signal generator 11, as well as the frequency to which amplifier 14 is tuned, must be selected in an appropriate manner so that the output signal frequency of the voltage controlled oscillator signal provides desired frequency.

According to one embodiment, the programmable counter can count beat frequency signal resulting from the mixing of the changing voltage controlled oscillator signal and a comb harmonic frequency signal produced by generator 11. Upon appropriate identification of preselected counts, the AFC loop including discriminator 18, stabilizes the oscillator output frequency. According to another embodiment, a particular frequency can be produced by the reference signal generator 11 and the first beat frequency identified by the system 16 can cause the automatic frequency control loop to provide appropriate oscillator stabilization. The frequencies to which the system can be tuned are determined by the frequencies available from the signal generator 11 as well as the frequency to which amplifier 14 is tuned.

It will be apparent to those skilled in the art that the initial frequency of the oscillator cannot be arbitrary. Therefore, a reset signal is applied to terminal 30 of control circuit 22. This reset signal causes a voltage determined by the position of the variable terminal of potentiometer 43 to be applied to oscillator 13 thereby determining an initial frequency. Similarly, the positive signal applied by system 16 to control circuit 22 must be applied upon removal of the reset signal from terminal 23 of system 16. In addition, the reset signal is used to reset the counting circuits of system 16. Following counter-resets, terminal 24 is used to provide system 16 with information designating the stabilized oscillator signal frequency by specifying conditions for removal of the positive signal from control circuit 22.

The circuit of FIG. 2 shows the oscillator control circuit and the summing circuit of the preferred embodiment. The reset signal is applied via terminal 30 to the gate terminal of transistor 45. The capacitor 37 is discharged to a value determined by the position of the variable element of potentiometer 43. Thereafter, the positive signal applied to terminal 27 causes the capacitor to store an increasing amount of charge resulting in an increasing voltage at terminal 28. Upon identification of the specified signal (e.g. a defined number of pulses) from the envelope detector 15, the positive signal is removed from terminal 27 and from control circuit 22. Thereafter, drift in oscillator frequency, caused by changes of the charge of the capacitor or other changes are corrected by means of the feedback loop including discriminator 18. An error signal applied by amplifier 29 to terminal 26 of summing network 17 is used to correct for the frequency variations. The capacitor provides a memory maintaining the desired frequency over a period of time.

In certain applications, a channel translator and other apparatus is used for changing the frequency of information channels. Such apparatus can compromise the information signal frequency stability that exists, for example, in commercial television broadcast signals. A receiver discriminator 19 can be placed in a feedback loop, replacing discriminator 18. In this instance, the center frequency of the discriminator will be determined by the mixing of a received (i.e. broadcast) signal and the voltage controlled oscillator. The voltage controlled oscillator is used to "track" or follow the drifting of the received signal ensuring appropriate operation of intermediate frequency apparatus. Capacitor 37 can still provide a memory for a temporary loss of received signal. The circuit parameters associated with capacitor 37 are arranged to provide a relatively slow response to input signals, thereby minimizing possible deleterious effects due to the presence of the AFC feedback loop. It will be clear to those skilled in the art, it is possible to provide a switch 21 with apparatus for replacing discriminator 19 with discriminator 18 upon loss of received signal.

A positive signal, applied to terminal 81, will cause the amplifier shown in FIG. 3A, to amplify with a polarity inverted from that when the positive signal is removed. Thus, only one amplifier is needed at the output of discriminator 18. The application of the positive signal at terminal 81 is determined in the preferred embodiment by circuits associated with system 16. The identification of a beat frequency above or the beat frequency below a center frequency will determine the state of amplifier 29. this decision can be determined by appropriate logic in programmable system 16.

the above description is included to illustrate the operation of the preferred embodiment and is not meant to limit the scope of the invention. The scope of the invention is to be limited only by the following claims. From the above discussion, many variations would be apparent to one skilled in the art that would yet be encompassed by the spirit and scope of the invention.

What is claimed is:

1. An electronic system for automatically tuning an oscillator to a selected frequency comprising:

a reference signal generator for generating a signal having a comb of reference frequencies;

a controllable oscillator;

oscillator control means for controlling the frequency of said oscillator;

mixer means for receiving signals from said signal generator and said oscillator and heterodyning same to produce an output signal having sum and difference frequencies;

tuned circuit means for receiving signals from said mixer means and for passing signals having a narrow band of frequencies centered about a predetermined beat frequency;

programmable means for receiving information designating said selected frequency, cooperable with said oscillator control means to initiate a frequency sweep of said oscillator beginning at an initial frequency, for detecting and counting occurrences of said predetermined beat frequency during said frequency sweep of said oscillator, and for causing said oscillator control means to terminate said frequency sweep of said oscillator upon detecting and counting a number of occurrences of said beat frequency determined by the information designating said selected frequency; and discriminator means continuously connected to said tuned circuit means and to said oscillator control means for providing an output indicative of whether the signal passed by said tuned circuit means has a frequency above or below said predetermined beat frequency and effective upon termination of said frequency sweep of said oscillator to cause said oscillator control means to stabilize the frequency of said local oscillator at said selected frequency.

2. An electronic system for automatically tuning an oscillator to a selected frequency comprising:

a reference signal generator for generating a signal having a comb of reference frequencies;

a controllable oscillator;

oscillator control means for controlling the frequency of said oscillator;

mixer means for receiving signals from said signal generator and said oscillator and heterodyning same to produce an output signal having sum and difference frequencies;

tuned circuit means for receiving signals from said mixer means and for passing signals having a narrow band of frequencies centered about a predetermined beat frequency;

programmable means for receiving information designating said selected frequency, cooperable with said oscillator control means to initiate a frequency sweep of said oscillator beginning at an initial frequency, for detecting and counting occurrences of said predetermined beat frequency during said frequency sweep of said oscillator, and for causing said oscillator control means to terminate said frequency sweep of said oscillator upon detecting and counting a number of occurrences of said beat frequency determined by the information designating said selected frequency;

discriminator means connected to said tuned circuit means and to said oscillator control means for providing an output indicative of whether the signal passed by said tuned circuit means has a frequency above or below said predetermined beat frequency and effective upon termination of said frequency sweep of said oscillator to cause said oscillator control means to stabilize the frequency of said local oscillator at said selected frequency; and an inverting/noninverting amplifier connecting said discriminator means to said oscillator control means.

3. The invention according to claim 2 wherein the mode of operation of said inverting/noninverting amplifier is controlled by said programmable means.

4. An electronic system for automatically tuning an oscillator to a selected frequency comprising:

a reference signal generator for generating a signal having a comb of reference frequencies;

a controllable oscillator;

oscillator control means for controlling the frequency of said oscillator;

mixer means for receiving signals from said signal generator and said oscillator and heterodyning same to produce an output signal having sum and difference frequencies;

tuned circuit means for receiving signals from said mixer means and for passing signals having a narrow band of frequencies centered about a predetermined beat frequency;

programmable means for receiving information designating said selected frequency, cooperable with said oscillator control means to initiate a frequency sweep of said oscillator beginning at an initial frequency, for detecting and counting occurrences of said predetermined beat frequency during said frequency sweep of said oscillator, and for causing said oscillator control means to terminate said frequency sweep of said oscillator upon detecting and counting a number of occurrences of said beat frequency determined by the information designating said selected frequency;

discriminator means connected to said tuned circuit means and to said oscillator control means for providing an output indicative of whether the signal passed by said tuned circuit means has a frequency above or below said predetermined beat frequency and effective upon termination of said frequency sweep of said oscillator to cause said oscillator control means to stabilize the frequency of said local oscillator at said selected frequency;

a second discriminator associated with a receiver;

a switch connected to said first identified discriminator, said oscillator control means, and to said second discriminator; and said switch being operable to selectively connect said first identified discriminator and said second discriminator to said oscillator control means.

5. The invention according to claim 1 further comprising means for adjusting said initial frequency.

6. In an electronic system for automatically tuning to a selected frequency, said system having a reference signal generator and having an oscillator control means, a controllable oscillator, a mixer, and a discriminator connected in a loop for stabilizing the frequency of said oscillator, an inverting/noninverting amplifier connecting said discriminator to said oscillator control means and operable to stabilize said local oscillator at a frequency a predetermined difference frequency to one side of a reference frequency when operating in the noninverting mode and to stabilize said local oscillator frequency at a frequency a predetermined difference frequency to the other side of said reference frequency when operating in the inverting mode.

7. The invention according to claim 6 further comprising programmable means for receiving information designating said selected frequency and for controlling the mode of operation of said inverting/noninverting amplifier.

* * * * *

UNITED STATES PATENT OFFICE

CERTIFICATE OF CORRECTION

Patent No. 3,913,029 Dated October 14, 1975

Inventor(s) Fred W. Caspari et al.

It is certified that error appears in the above-identified patent and that said Letters Patent are hereby corrected as shown below:

Column 3, lines 49-51, "The output signal generator 11 is also applied to mixing circuit 12." should be deleted.

Column 7, line 30, "the" should read -- The --.

Signed and Sealed this

*twentieth* Day of *April 1976*

[SEAL]

*Attest:*

RUTH C. MASON
*Attesting Officer*

C. MARSHALL DANN
*Commissioner of Patents and Trademarks*